United States Patent
Stirk et al.

(10) Patent No.: US 9,813,063 B2
(45) Date of Patent: Nov. 7, 2017

(54) METHOD OF USING A FIELD-EFFECT TRANSISTOR AS A CURRENT SENSING DEVICE

(71) Applicant: Apple Inc., Cupertino, CA (US)

(72) Inventors: Gary L. Stirk, West Melbourne, FL (US); Karthik Kadirvel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 139 days.

(21) Appl. No.: 14/705,600

(22) Filed: May 6, 2015

(65) Prior Publication Data

US 2016/0178705 A1 Jun. 23, 2016

Related U.S. Application Data (60) Provisional application No. 62/096,323, filed on Dec. 23, 2014.

(51) Int. Cl.
*H03K 19/0175* (2006.01)
*G01R 31/36* (2006.01)
(Continued)

(52) U.S. Cl.
CPC . *H03K 19/017509* (2013.01); *G01R 31/3655* (2013.01); *G01R 31/3675* (2013.01);
(Continued)

(58) Field of Classification Search
CPC .............. G01R 31/3675; G01R 31/3655; H02J 7/0052; H02J 7/007; H02J 2007/0059
See application file for complete search history.

(56) References Cited

U.S. PATENT DOCUMENTS

| 4,316,106 A | 2/1982 | Young |
| 5,636,087 A | 6/1997 | Matsuzaki |

(Continued)

FOREIGN PATENT DOCUMENTS

| DE | 102013100799 | 6/2014 |
| EP | 2485293 | 8/2012 |

OTHER PUBLICATIONS

Office Action and Search Report in ROC (Taiwan) Patent Application No. 104135645 issued Oct. 4, 2016.
(Continued)

*Primary Examiner* — Drew A Dunn
*Assistant Examiner* — Sailesh Thapa
(74) *Attorney, Agent, or Firm* — Meyertons, Hood, Kivlin, Kowert & Goetzel, P.C.

(57) ABSTRACT

An apparatus may include one or more registers configured to store a plurality of values, and an analog-to-digital converter (ADC). Each value of the plurality of values may correspond to a characteristic of a transistor at a respective temperature value. The ADC may be configured to generate a digital value corresponding to a difference in voltage levels between a first terminal and a second terminal of the transistor. The apparatus may further include a sensor configured to measure a temperature, and control logic configured to generate a first voltage level at a control terminal of the transistor and receive the digital value from the ADC. The control logic may be further configured to determine, during a first operational mode, a current passing through the transistor dependent upon the digital value, at least one value of the plurality of values, and the temperature.

20 Claims, 4 Drawing Sheets

(51) Int. Cl.
*H02J 7/00* (2006.01)
*H03L 7/00* (2006.01)
*G06F 13/42* (2006.01)

(52) U.S. Cl.
CPC ............ *H02J 7/007* (2013.01); *H02J 7/0026* (2013.01); *H02J 7/0052* (2013.01); *H02J 7/0068* (2013.01); *H03L 7/00* (2013.01); *G06F 13/4256* (2013.01); *H02J 7/0021* (2013.01); *H02J 2007/0059* (2013.01); *Y02B 60/1228* (2013.01); *Y02B 60/1235* (2013.01)

(56) References Cited

U.S. PATENT DOCUMENTS

| | | | |
|---|---|---|---|
| 5,760,725 A | 6/1998 | Yoshida | |
| 6,421,270 B1 | 7/2002 | Tai | |
| 7,902,778 B2 | 3/2011 | Yamashita et al. | |
| 8,102,211 B2 | 1/2012 | Shi | |
| 8,139,953 B2 | 3/2012 | Okayasu | |
| 8,219,333 B2 | 7/2012 | Li | |
| 8,450,982 B2 | 5/2013 | Matsuda et al. | |
| 8,779,744 B2 | 7/2014 | Kahn | |
| 2005/0094333 A1* | 5/2005 | Astala | H02J 7/0029 361/35 |
| 2008/0091362 A1 | 4/2008 | Tae | |
| 2013/0063093 A1* | 3/2013 | Sato | H02J 7/00 320/134 |
| 2013/0221926 A1 | 8/2013 | Furtner | |
| 2014/0125274 A1 | 5/2014 | Kim | |

OTHER PUBLICATIONS

International Search Report and Written Opinion in application No. PCT/US2015/055405 dated Jan. 28, 2016.
International Prelininary Report on Patentability in application No. PCT/US2015/055405 dated Jul. 6, 2017.

\* cited by examiner

METHOD OF USING A FIELD-EFFECT TRANSISTOR AS A CURRENT SENSING DEVICE

PRIORITY CLAIM

The present application claims benefit of priority to U.S. Provisional Application No. 62/096,323, filed on Dec. 23, 2014, which is hereby incorporated by reference in its entirety as though fully and completely set forth herein. In the event any statements seemingly conflict, then the statements disclosed in the present application supersede the conflicting statements disclosed in U.S. Provisional Application No. 62/096,323.

BACKGROUND

Technical Field

Embodiments described herein are related to the field of integrated circuits, and more particularly to a battery management circuit to communicate between integrated circuits and provide battery protection.

Description of the Related Art

Computing systems may include one or more systems-on-a-chip (SoCs), which may integrate a number of different functions, such as application execution, graphics processing, and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Various computing systems may include one or more power sources, such as batteries for example, for supplying power to some or all of the system. For various reasons, a current provided by one or more of the power sources (i.e., a supply current) may be monitored within the system. Supply currents may be monitored, for example, to track and compare power consumed by one or more portions of the computing system, to estimate a remaining power available from the power source, or to profile energy usage over time. One method for monitoring a current from a power source includes placing a resistor in series with the power source and measuring a voltage level across the resistor. Using Ohm's law, a value for the current may be determined from the resistance of the resistor and the voltage level across the resistor. This method, however, requires the addition of a resistor that remains in the power supply path even if current measurements are not actively being taken, which may result in power wasted through the resistor and, therefore, not available to the system. This resistor may also be an added component to the system that may not be used for any other purpose than current measurements, thereby adding cost.

SUMMARY OF THE EMBODIMENTS

Various embodiments of a battery management circuit are disclosed. Broadly speaking, a system, an apparatus, and a method are contemplated in which the apparatus may include one or more registers configured to store a plurality of values, wherein each value of the plurality of values may correspond to a characteristic of a transistor at a respective one of a plurality of temperature values. An analog-to-digital converter (ADC) may be configured to generate a first digital value corresponding to a difference in voltage levels between a first terminal and a second terminal of the transistor. The apparatus may further include a sensor configured to measure a temperature, and control logic configured to generate a first voltage level at a control terminal of the transistor. The control logic may be further configured to receive the first digital value from the ADC, and to determine, during a first operational mode, a current passing through the transistor dependent upon the first digital value, at least one value of the plurality of values, and the temperature.

In a further embodiment, the control logic may be further configured to determine, during a second operational mode, that the temperature is at a higher temperature value than each of the plurality of values stored in the one or more registers, and to determine, during the second operational mode, a new value for the characteristic of the transistor. The control logic may also replace, in the one or more registers, at least one value of the plurality of values with the new value.

In an embodiment, the control logic may be further configured to determine, during a second operational mode, that the temperature is at a lower temperature value than each of the plurality of values stored in the one or more registers, and to determine, during the second operational mode, a new value for the characteristic of the transistor. The control logic may also replace, in the one or more registers, at least one value of the plurality of values with the new value.

In a further embodiment, the second operational mode may correspond to a battery charging mode. In one embodiment, to determine a new value for the characteristic of the transistor, the control logic may be further configured to receive a value of a charging current from a charger circuit.

In another embodiment, to generate the first voltage level at the control terminal of the transistor, the control logic may be further configured to enable a charge pump. In a further embodiment, the charge pump may be further configured to adjust the first voltage level at the control terminal of the transistor dependent upon the second digital value.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Portable devices may utilize one or more battery cells for providing power to the circuits of the device. Each battery cell includes a positive and negative terminal capable of providing voltage and current to one or more of the circuits. In some devices, battery management circuits may be used to monitor and manage the performance of the battery cells. Some such devices may use a single management circuit to manage the battery cells while other devices may use one management circuit for each battery cell. Providing a dedicated management circuit to each battery cell may provide advantages such as allowing the circuit to be placed adjacent to, or even within a package of the cell.

Current supplied from one or more battery cells may be monitored by a battery management circuit coupled to a respective battery cell. A common method for measuring current includes placing a resistor in series with a supply line from a battery cell. This method may have disadvantages, such as increasing an impedance of the load on the battery, thereby consuming additional energy that could otherwise power the device. Another disadvantage may be requiring an additional component that might otherwise be unnecessary, requiring space on a circuit board or battery package and requiring another component to be purchased and kept in inventory.

A current measuring method is disclosed herein which may allow for a current to be measured without adding components that would otherwise not be necessary. In addition, the disclosed method may allow current measurements without placing additional resistance in the batteries' load.

It is noted that, although battery management circuits are used herein to demonstrate the disclosed concepts, these concepts may apply to other types of circuits requiring measurements of a current. For example, the concepts may apply to power supplies other than batteries, such as Power over Ethernet (PoE) or supercapacitors.

Many terms commonly used in reference to IC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

Figure 1:
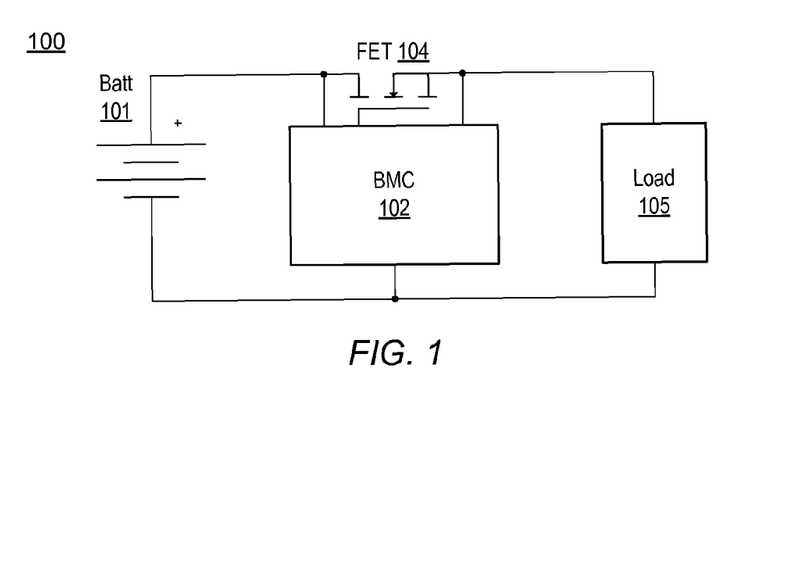
FIG. 1 illustrates an embodiment of a battery management system.

A block diagram of a system including a battery and battery management circuit is shown in FIG. 1. System 100 includes battery (batt) 101, battery management circuit (BMC) 102, Field Effect Transistor (FET) 104, and load 105. System 100 may correspond to a portion of a portable computing system, such as a laptop computer, smartphone, tablet or wearable device.

Battery 101 may be a single battery cell or a plurality of battery cells coupled together to produce a single output voltage. In various embodiments, battery 101 may be rechargeable or disposable. In the present embodiment, battery 101 provides power to load 105 and to BMC 102.

BMC 102 manages the performance of battery 101 by measuring and tracking current supplied by battery 101 to load 105. If battery 101 is rechargeable, BMC 102 may also enable and track a recharging current into battery 101. BMC 102 may maintain operational or statistical information regarding battery 101 such as, for example, an amount of charge used/remaining, an average current supplied, a peak current supplied, a number of charging cycles battery 101 has undergone, and an elapsed time for a current charging cycle. BMC 102 may be communicatively coupled to a processor in system 100 (not shown) to receive commands from the processor and to provide the maintained battery information to the processor.

BMC 102 turns FET 104 on and off. FET 104 may be used as a power switch to allow current to pass from battery 101 to load 105 or to disable circuits included in load 105. In a rechargeable system, BMC 102 may also turn FET 104 on to allow recharging of battery 101. Current from battery 101 may flow through FET 104 whenever it is turned on, either for supplying power from battery 101 or for charging battery 101. Although FET 104 is illustrated and described as a field effect transistor, in other embodiments, FET 104 may be implemented as a bipolar junction transistor (BJT), a junction gate field-effect transistor (JFET), or any other suitable type of transistor. In some embodiments, FET 104 may correspond to multiple transistors.

In the illustrated embodiment, BMC 102 determines a current through FET 104. To determine current flowing through FET 104, BMC 102 applies a voltage to the control terminal (also referred to herein as the "gate terminal" or simply "gate") of FET 104. Voltage levels are measured at each end of the transistor channel, i.e. the source and drain terminals, and subtracted to determine a voltage level from the drain to the source of FET 104. Current through FET 104 can be determined if the "on" resistance of the transistor channel is known. "On resistance" refers to a resistance of the transistor channel when a voltage at the gate of the transistor is at a sufficient level to cause the transistor to turn on, i.e., conduct with low impedance. In regards to a FET, the on resistance may also be referred to as a drain-to-source resistance, or simply $R_{DS}(on)$. A data sheet for a commercially available transistor may provide typical and or maximum values for the $R_{DS(ON)}$ of FET 104. Additionally, $R_{DS(ON)}$ may be determined for a given transistor during a testing operation during manufacturing of the system.

Figure 2:
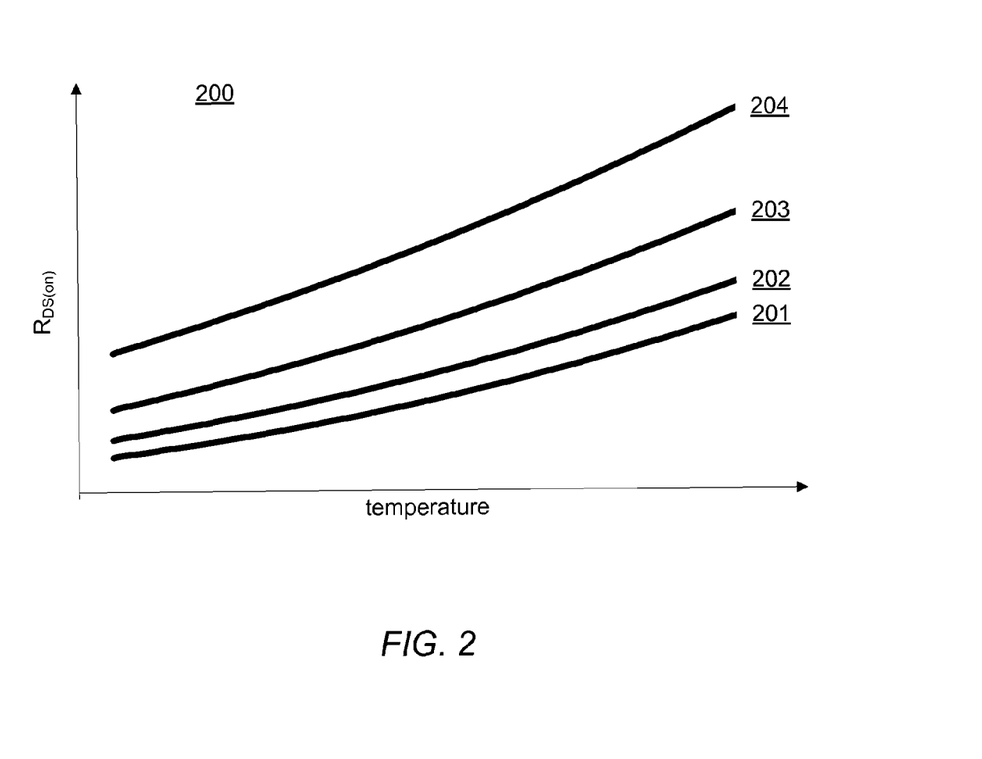
FIG. 2 illustrates a chart showing resistance through a field-effect transistor versus temperature for various control voltages.

Determining current through FET 104 may present some obstacles, however. For example, the $R_{DS(ON)}$ may change dependent upon the operating temperature of FET 104. FIG. 2 shows chart 200 illustrating a relationship between temperature and $R_{DS(ON)}$ for an embodiment of FET 104. Each curve, 201 through 204, may reflect the $R_{DS(ON)}$ versus temperature curve for a different voltage level of the gate of FET 104. In some embodiments, curve 201 may correspond to the $R_{DS(ON)}$ versus temperature curve at a first gate voltage. Curves 202 through 204 may each correspond to an increasingly lower gate voltage if FET 104 is an n-channel FET (or increasingly higher gate voltage if FET 104 is a p-channel FET). As shown by each of the curves, $R_{DS(ON)}$ increases at higher temperatures and increases for lower gate voltages. Therefore, to determine the current through FET 104, the temperature and gate voltage of FET 104 are needed.

Computing devices may include temperature sensors for use with other operations in the system. These temperature sensors may be used to determine a temperature of FET 104. If, however, both the gate voltage and temperature of FET 104 are variable, then the calculation to determine $R_{DS(ON)}$ may be complicated and/or require a large data table. The calculation may be simplified by fixing either temperature or gate voltage to an approximately constant value. In many systems, and particularly in portable systems, temperature may be difficult to hold steady during operation of the system. The gate voltage, however, may be maintained since BMC 102 provides the gate voltage to FET 104. Systems and methods for monitoring temperature and providing a stable gate voltage are presented below.

Load 105 represents any circuit or circuits receiving power from battery 101. In various embodiments, load 105 may be a single IC, a complete portable computing device, or a portion of a computing device. BMC 102 may, in some embodiments, be included in load 105. Load 105, may, in embodiments in which battery 101 is rechargeable, include circuits for relaying a recharging current to battery 101.

It is noted that system 100 of FIG. 1 and chart of FIG. 2 are merely examples for demonstrating the disclosed concepts. Other embodiments of system 100 may include more components. For example, BMC 102 may measure more than one FET in order to monitor multiple power supply lines from battery 101 to multiple loads. Although system 100 is illustrated with a single battery and single BMC, any suitable number of batteries and corresponding BMCs may be utilized in other embodiments. The curves in chart 200 are intended to demonstrate a general relationship among temperature, gate voltage, and $R_{DS(ON)}$. The curves are not intended to imply specific values for any of these variables.

Figure 3:
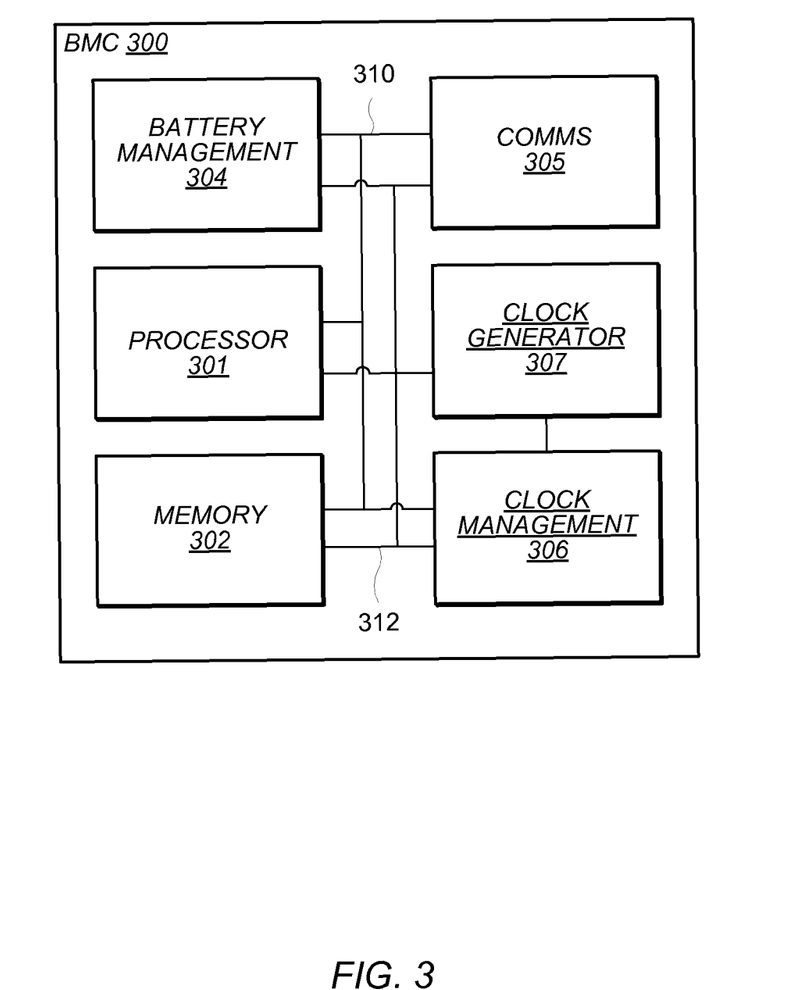
FIG. 3 illustrates an embodiment of a block diagram of a battery management circuit.

Moving to FIG. 3, a block diagram of an embodiment of a System on a Chip (SoC) is illustrated. In the illustrated embodiment, the SoC may correspond to a battery management circuit (BMC) 300 and include processor 301 coupled to memory block 302, battery management unit 304, communication block 305, clock management unit 306, all coupled through bus 310. In addition, clock generator 307 may be coupled to clock management unit 306. Clock generator 307 may provide one or more clock signals 312 to the functional blocks in BMC 300. In some embodiments, BMC 300 corresponds to BMC 102 in FIG. 1.

Processor 301 may, in various embodiments, be representative of a general-purpose processor that performs computational operations. For example, processor 301 may be a central processing unit (CPU) such as an embedded processor, a microcontroller, an application-specific integrated circuit (ASIC), or a field-programmable gate array (FPGA). In some embodiments, processor 301 may include multiple CPU cores and may include one or more register files and memories.

In various embodiments, processor 301 may implement any suitable instruction set architecture (ISA), such as, e.g., ARM Cortex, or PowerPC™ ISAs, or combination thereof. Processor 301 may include one or more bus transceiver units that allow processor 301 to communicate to other functional blocks via bus 310, such as, memory block 302, for example.

Memory block 302 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as memory block 302 and other embodiments may include more than two memory blocks (not shown). In various embodiments, memory block 302 may be configured to store program instructions that may be executed by processor 301, store data to be processed, or a combination thereof.

Battery management unit 304 includes circuits to manage the performance of a battery coupled to BMC 300. Battery management unit 304 may include one or more analog-to-digital converters (ADCs) for measuring voltage levels of sensors, such as, e.g., sensor element 103 in FIG. 1. Battery management unit 304 may include additional circuits for measuring temperature, measuring charge/coulombs, and controlling charging of the coupled battery. Management of power switches may also be included in battery management unit 304, allowing control of power flowing to and from the battery. For example, battery management unit 304 may enable a first operating mode for powering a computing system from the battery as well as a second operating mode for recharging the battery when the system is coupled to an alternate power supply.

Communication block 305 includes circuits for communicating with other ICs. Communication block may include circuits for supporting multiple communication protocols, such as, for example, inter-integrated circuit (I²C), universal asynchronous receiver/transmitter (UART), and serial peripheral interface (SPI). In addition, communication block 305 may include support for a communication protocol that enables communication amongst two or more BMCs.

Clock management unit 306 may be configured to enable, configure and monitor outputs of one or more clock sources. In various embodiments, the clock sources may be located in clock generator 307, communication block 305, within clock management unit 306, in other blocks within BMC 300, or come from an external signal coupled through one or more input/output (I/O) pins. In some embodiments, clock management 306 may be capable of configuring a selected clock source before it is distributed throughout BMC 300. Clock management unit 306 may include circuits for synchronizing an internal clock source to an external clock signal.

Clock generator 307 may be a separate module within BMC 300 or may be a sub-module of clock management unit 306. One or more clock sources may be included in clock generator 307. In some embodiments, clock generator 307 may include PLLs, FLLs, DLLs, internal oscillators, oscillator circuits for external crystals, etc. One or more clock signal outputs 312 may provide clock signals to various functional blocks of BMC 300.

System bus 310 may be configured as one or more buses to couple processor 301 to the other functional blocks within the BMC 300 such as, e.g., memory block 302, and I/O block 303. In some embodiments, system bus 310 may include interfaces coupled to one or more of the functional blocks that allow a particular functional block to communicate through the bus. In some embodiments, system bus 310 may allow movement of data and transactions (i.e., requests and responses) between functional blocks without intervention from processor 301. For example, data received through the I/O block 303 may be stored directly to memory block 302.

It is noted that the BMC illustrated in FIG. 3 is merely an example. In other embodiments, different functional blocks and different configurations of functions blocks may be possible dependent upon the specific application for which the BMC is intended.

Figure 4:
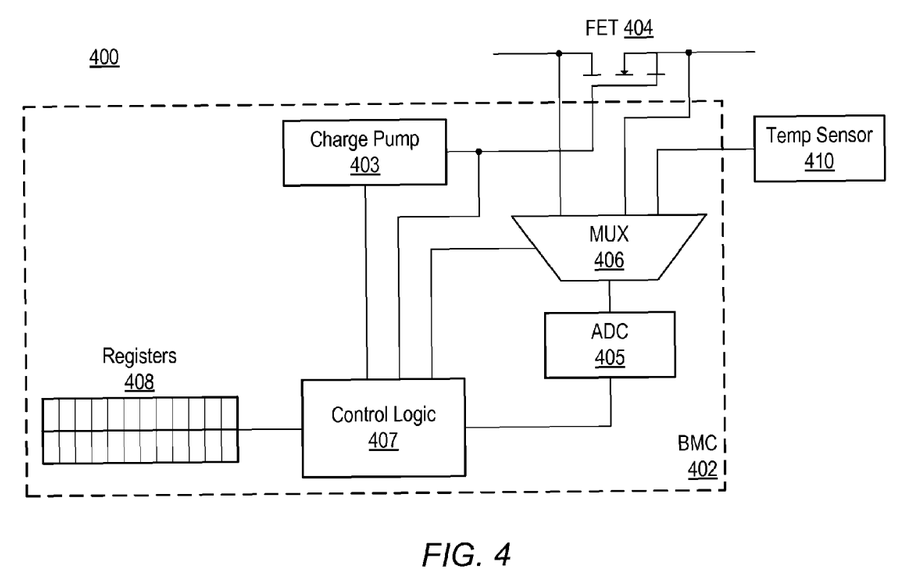
FIG. 4 illustrates a block diagram for an embodiment of a current measurement unit of a battery management circuit.

Moving now to FIG. 4, a block diagram for an embodiment of battery management system 400 is illustrated. System 400 includes battery management circuit (BMC) 402 (corresponding to BMC 102 in FIG. 1), Field Effect Transistor (FET) 404, and temperature sensor 410. BMC 402 includes control logic 407 coupled to charge pump 403, multiplexing circuit (MUX) 406, analog to digital converter 405, and one or more registers 408.

In the present embodiment, FET 404 corresponds to FET 104 in FIG. 1 and, therefore, corresponds to the description of FET 104 above. Temperature sensor 410 may be any suitable device or circuit for determining temperature, such as, for example, a thermocouple, thermistor, or diode temperature sensor. In some embodiments, temperature sensor 410 may be included primarily to measure the temperature of FET 404 and, therefore, may be physically located adjacent to FET 404. In other embodiments, temperature sensor 410 may be used for other purposes in addition to monitoring the temperature of FET 404. In such embodiments, temperature sensor 410 may be physically located in a different area than FET 404, in which case, the temperature of FET 404 may be estimated based on a temperature reading of the sensor. In some embodiments, temperature sensor 410 may be included within BMC 402 as part of a same IC.

BMC 402 may correspond to BMC 102 in FIG. 1 in the current embodiment. BMC 402 performs the tasks previously described for BMC 102, including determining a current passing through FET 404. During a normal mode of operation of system 400, with a battery, such as battery 101 of FIG. 1, supplying power to the system, control logic 407 enables charge pump 403, thereby generating a predetermined voltage level on the gate terminal of FET 404 and turning FET 404 on. To determine the current through FET 404, the voltage level of the output of charge pump 403 is monitored by control logic 407 to determine if the output of charge pump 403 is higher, lower, or at the predetermined gate voltage level. In some embodiments, the output of the charge pump may be used by the charge pump as a control input to adjust the voltage level of the output.

As described above, maintaining a constant gate voltage on FET 404 may reduce a size of a lookup table and/or a number of calculations used to determine the $R_{DS(ON)}$ of FET 404. If control logic 407 determines that the output voltage level of charge pump 403 is too high or too low, then control logic 407 will adjust charge pump 403 to reduce or increase the output voltage level accordingly in order to achieve the desired constant gate voltage.

It is noted that a "constant voltage," as used herein, does not imply a perfectly stable voltage level. Various conditions within and external to an IC may cause small deviations to a voltage level otherwise being held constant. A "constant voltage" or "constant voltage level" as used herein, is intended to indicate a steady voltage level with only small deviations from an intended voltage level.

Control logic 407 may set MUX 406 to select an output from temperature sensor 410 as an input to ADC 405. In the illustrated embodiment, temperature sensor 410 outputs a signal with a voltage level corresponding to a current temperature of the sensor. ADC 405 converts the output from temperature sensor 410 into another digital value which is again read by control logic 407. Control logic 407 reads data corresponding to the $RD_{DS(ON)}$ of FET 404 from registers 408. The data in registers 408 may include one or more $R_{DS(ON)}$ values for FET 404 along with a corresponding temperature value for each included $R_{DS(ON)}$ value. In other embodiments, the data in registers 408 may include a temperature coefficient of FET 404, expressed in terms of an amount of $R_{DS(ON)}$ resistance per degree Celsius (or other temperature scale) for FET 404. Control logic 407 uses the stored data from registers 408 along with the digital value corresponding to the measured temperature to determine a value for the $R_{DS(ON)}$ of FET 404.

ADC 405 may be implemented as a single ADC circuit that converts the voltage level of a single signal selected with MUX 406 into a respective digital value. The digital value may be buffered until control logic 407 reads the value. ADC may utilize any suitable type of ADC circuits, such as, for example, a Sigma-Delta converter or a successive approximation circuit. In some embodiments, ADC 405 may include multiple ADC circuits each capable of measuring a voltage level of a selected input. In such embodiments, multiple MUX 406 circuits may be included, one for each ADC circuit.

Control logic 407 also sets MUX 406 to couple the drain and source terminals of FET 404 to ADC 405. ADC 405 converts the voltage levels of the coupled terminals into respective digital values. Alternatively, ADC 405 may convert the voltage levels of the coupled terminals into a single digital value representing the voltage from the drain to the source. Control logic 407 reads the converted digital values from ADC 405. Using Ohm's Law, current through FET 404 is calculated by dividing the voltage from the drain to the source of FET 404 by the $R_{DS(ON)}$ determined for the measured temperature at the predetermined gate voltage level.

An accuracy of the current measurement is dependent upon an accuracy of the voltage measurements and the accuracy of determining $R_{DS(ON)}$. The accuracy of the voltage measurements may be controlled by the design of ADC 405 and the electrical paths from the drain and source terminals of FET 404 to the inputs of ADC 405. ADC circuits such as sigma-delta converters may provide suitable accuracy. The paths from the terminals of FET 404 to the inputs of ADC 405 may be designed such that interference from signals in other portions of the system is negligible and the paths themselves may be designed to couple the terminals to ADC 405 with negligible impedance.

The determination of $R_{DS(ON)}$ may be controlled by using an accurate temperature sensor 410 and employing similar paths from temperature sensor 410 to ADC 405 as used for the terminals of FET 404. During manufacturing of system 400, the data stored in the one or more registers 408 that includes resistance characteristics of FET 404 may initially be provided from a data sheet provided by the manufacturer of FET 404. During manufacturing, however, processing variations may result in FETs that deviate to some degree from device to device. Values included in a data sheet, therefore, may represent a "typical" device, a best-case device, or a worst-case device. A factory test of the system with FET 404 installed may allow for the data sheet values to be adjusted to more accurately represent the installed FET 404. In a manner similar to the measurement of the current through FET 404, the $R_{DS(ON)}$ of FET 404 for a given temperature may be measured during operation of system 400 if a predetermined current can be passed through FET 404.

In the present embodiment, BMC 402 also supports recharging of battery 101. During the recharging mode, circuits within system 400 provide battery 101 with a predetermined recharging current. In the illustrated embodiment, the recharging current passes through FET 404, while in other embodiments, another FET of the same type as FET 404 may be used to couple the source of the recharging current to battery 101. During a recharging mode, control logic 407 enables charge pump 403 and may monitor the voltage level of the output as described above for the normal mode of operation. Other circuits (not shown in FIG. 5) provide a predetermined current that passes through FET 404. The recharging temperature is measured using temperature sensor 410 as previously described. If the recharging temperature is determined to be higher than a previously measured high recharging temperature or lower than a previously measured low recharging temperature, then control logic 407 initiates an $R_{DS(ON)}$ measurement of FET 404.

To measure a new $R_{DS(ON)}$ value for FET 404, the voltage levels of the drain terminal and gate terminal are again measured using MUX 406 and ADC 405. Control logic 407 receives the digital values for the voltage from the drain to source terminals. Using a digital value representing the predetermined recharging current, the $R_{DS(ON)}$ for the measured temperature can be determined by dividing the drain-source voltage by the predetermined current value. Control logic 407 may store the new $R_{DS(ON)}$ value in registers 408 along with the corresponding recharging temperature reading. In other embodiments, control logic 407 may also determine a coefficient for $R_{DS(ON)}$ versus temperature and store this value in registers 408 in addition to, or in place of the $R_{DS(ON)}$ value.

System 400 may continue to measure $R_{DS(ON)}$ during the recharging mode. Control logic 407 may only store new values related to $R_{DS(ON)}$ corresponding to a highest recharging temperature and a lowest recharging temperature. If a new $R_{DS(ON)}$ value is determined at a temperature that is higher than a previous highest measurement temperature, then control logic 407 replaces the $R_{DS(ON)}$ corresponding to the previous highest temperature with the data corresponding to the new highest temperature. A similar method may apply to the lowest temperature measurements. In other embodiments, any suitable number of $R_{DS(ON)}$ measurements may be stored to registers 408.

It is noted that battery management system 400 of FIG. 4 merely illustrates an example embodiment. Only the components necessary to demonstrate the disclosed concepts are shown. In other embodiments, additional components may be included, such as circuits for recharging a battery. A different number of components may be included in other embodiments, such as, for example, multiple ADCs and multiple multiplexing circuits.

Figure 5:
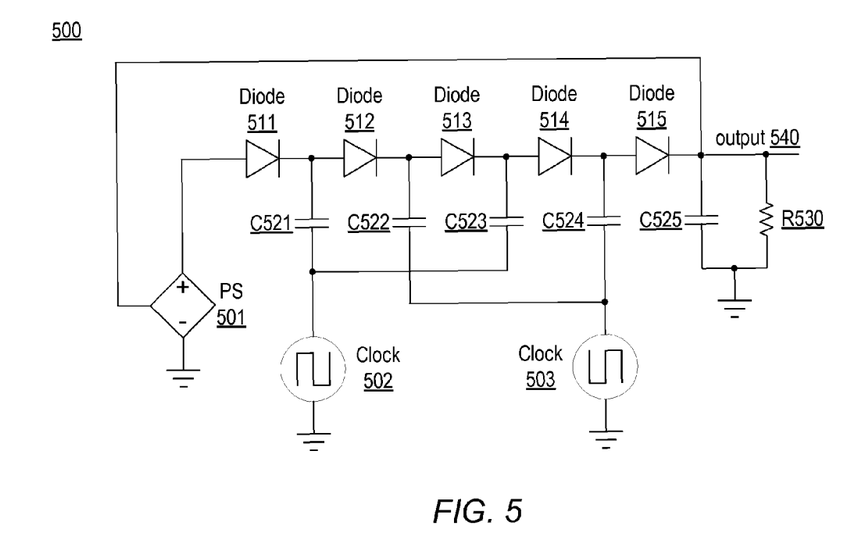
FIG. 5 shows an embodiment of a circuit diagram of a charge pump.

Turning now to FIG. 5, a circuit diagram of an embodiment of a charge pump is illustrated. Charge pump 500 may correspond to charge pump 403 within BMC 402 in FIG. 4. Charge pump 500 includes power supply (PS) 501 coupled to diode 511 which in turn is coupled to diode 512 through diode 515, each coupled in series to the previous diode. Clock source 502 is also included, coupled to capacitors C521 and C523. Charge pump 500 also includes clock source 503 coupled to capacitors C522 and C524. Capacitor C525 and resistor R530 are coupled to the output of diode 515. Charge pump 500 includes the output signal, charge pump output 540.

In the illustrated embodiment, power supply 501 is a voltage-controlled voltage source. A voltage level of the output of power supply 501 is determined by a voltage level of an input to power supply 501. Output 540 is coupled to the input of power supply 501. In some embodiments, additional circuits (not shown) may be coupled between output 540 and the input of power supply 501 to scale and/or invert the voltage level of output 540 before reaching power supply 501. Clock sources 502 and 503, when enabled, output non-overlapping clock signals of a same frequency, i.e., clock signals 180 degrees out of phase. Diodes 511 through 515 may, in some embodiments, be implemented as diode connected transistors. Capacitors C521 through C524 each have similar capacitance values, while capacitor C525 may have any suitable capacitance value. Resistor R530 may have any suitable resistance value.

When charge pump 500 is disabled, power supply 501 and clock sources 502 and 503 may be disabled and, therefore, output voltage levels equal to a ground reference voltage, i.e., approximately zero volts. Capacitors C521 through C525 discharge to a voltage level of the ground reference, and output 540, therefore may be approximately zero volts. In response to enabling charge pump 500, power supply 501 an is enabled. Since output is at zero volts, the input of power supply 501 may be zero volts. In the present embodiment, a lower voltage at the input of power supply 501 produces a higher voltage, so the zero volts input from output 540 increases the voltage level of power supply 501 to a first voltage level. Clock sources 502 and 503 may remain stable until capacitors C521-525 charge in response to the first voltage level. As the voltage level of C525 rises, the input to power supply 501 also rises, resulting in the voltage level of power supply 501 falling until stabilizing at a second voltage level.

Clock sources 502 and 503 may be enabled when power supply 501 reaches the second voltage level. The output of clock source 502 may transition first, rising to the second voltage level while clock source 503 remains low. The high phase of clock source 502 drives the voltage levels of the inputs of diodes 512 and 514 to rise to twice the second voltage level. Accordingly, charge flows from C521 and C523 to C522 and C524, respectively, charging C522 and C524 to greater than the second voltage level. This charge transfer continues until clock source 502 transitions low and clock source 503 transitions high. At the time clock source 503 transitions high, the inputs of diodes 513 and 515 are now greater than twice the second voltage level and charge begins flowing from C522 and C524 to C523 and C525, respectively. C521 is recharged from power supply 501. When clock source 503 transitions low and clock source 502 transitions high, charge will again flow from C521 and C523 to C522 and C524, respectively. As clock sources 502 and 503 continue to oscillate, the voltage levels across each capacitor, as well as power supply 501, begin to stabilize. The voltage level across C521 stabilizes near the voltage level of power supply 501. The voltage level across C522 stabilizes near twice the voltage level of C521, the voltage level across C523 approaches three times the level of C521, and the voltage levels across C524 and C525 will each be approximately four times the voltage level of power supply 501.

It is noted, that, as used herein, a voltage level "stabilizing" refers to a signal reaching a voltage level from which deviations are comparatively negligible. Circuits and signals in an integrated circuit may be susceptible to various influences, such as signal noise coupled from other, nearby circuits. Such influence may cause deviations in the voltage level of an otherwise steady-state signal.

The output of diode 515 is coupled to charge pump output 540. The voltage level of the charge pump output 540 may, therefore, reach four times the voltage level of power supply 501. In some embodiments, control circuitry, such as control logic 407 in FIG. 4, may adjust the charge pump output 540 voltage level by adjusting clock sources 502 and 503. By reducing the duty cycle of the clock sources or by blocking one or more high transitions of each clock source, charge pump output 540 may be reduced to a voltage level between the ground reference voltage level and four times the voltage level of power supply 501. By monitoring the charge pump output 540, control logic 407 may adjust the voltage level of charge pump output 540 to generate a predetermined voltage level for the gate terminal of FET 404. As previously mentioned, using a stable, consistent voltage level for the gate terminal may simplify calculations for determining the current through FET 404.

It is noted that charge pump 500 of FIG. 5 is merely an example of a charge pump circuit. The circuit diagram of FIG. 5 has been simplified to highlight features relevant to this disclosure. In other embodiments, additional components may be included. The components shown in FIG. 5 are not intended to illustrate physical locations of components used in actual circuits.

Figure 6:
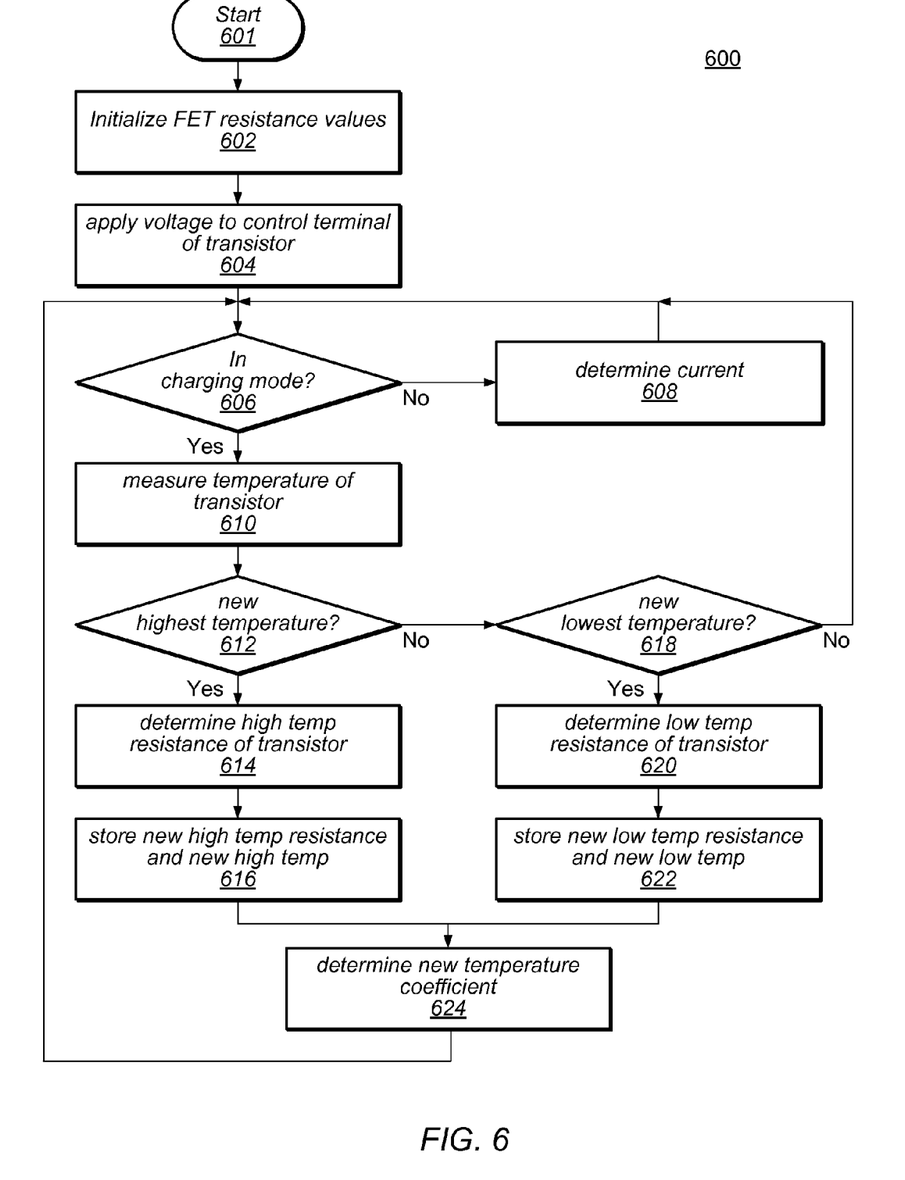
FIG. 6 illustrates a flow diagram for an embodiment of a method for using a FET transistor as a current sensing device.

Moving to FIG. 6, a flow diagram for an embodiment of a method for using a FET transistor as a current sensing device is shown. The method may be applied to a battery management circuit, such as, for example, BMC 402 in FIG. 4. Referring collectively to system 400 of FIG. 4, and the flowchart in FIG. 6, the method begins in block 601.

Initial values for the $R_{DS(ON)}$ of FET 404 may be stored in BMC 402 (block 602). These initial values may be programmed into non-volatile memory in BMC 402 during a manufacturing or test process, may be programmed in fuses in the BMC 402, etc. The initial values may be determined from a data sheet for FET 404 or may be determined from testing.

BMC 402 enables a voltage at a gate terminal of FET 404 (block 604). BMC 402 may enable the gate voltage in response to system 400 entering a standard operating mode. In the present embodiment, control logic 407 enables charge pump 403, thereby generating a voltage level at the gate terminal. This voltage level may be monitored, allowing control logic 407 to adjust charge pump 403 until the predetermined gate voltage level is reached.

Further operations of the method may depend on an operating mode of system 400 (block 606). Control logic 407 may determine if system 400 is in a normal operating mode in which power is supplied by a battery in the system, or if the system is in a charging mode in which power is supplied to a battery in the system. If system 400 is in a charging mode, then the method moves to block 610 for a temperature measurement. Otherwise, the method moves to block 608 to determine a current through FET 404.

The current through FET 404 is determined dependent upon the resistance of FET 404 and the voltage across FET 404 (block 608). Control logic 407 determines a value for the current through FET 404 using a value for a voltage from the drain terminal to the source terminal of FET 404, a value for a temperature of system 400 and an $R_{DS(ON)}$ value for FET 404. The voltage across the terminals of FET 404 may be measured using ADC 405 to measure the voltage level at the drain terminal and the voltage level of the source terminal and then subtracting. The temperature is determined by measuring a voltage level of temperature sensor 410 using ADC 405. The $R_{DS(ON)}$ value is read from registers 408. A temperature coefficient may also be read and used to determine the $R_{DS(ON)}$ value at the measured temperature. In some embodiments, the determined values may be used in equation (1) to determine the current.

$$I_{FET} = V_{FET} \div (R_{DS(ON)25} + TC(T_{FET} - 25)) \quad (1)$$

In equation (1), $I_{FET}$ is the current through FET 404, $V_{FET}$ is the measured voltage across FET 404, $R_{DS(ON)25}$ is the value of $R_{DS(ON)}$ at 25° C. (from a data sheet value or from a factory test), TC is the temperature coefficient, and $T_{FET}$ is the measured temperature. The resulting current value may be buffered in BMC 402 until read, or sent to another circuit within BMC 402. More particularly, the current may indicate the amount of charge flowing from the battery, and thus may be used to track the charge in the battery. The method returns to block 606 to determine the operating mode again.

If system 400 is determined to be in the charging mode in block 606, then BMC 402 measures an output of temperature sensor 410 (block 610). Temperature sensor 410 outputs a voltage level corresponding to a temperature of the sensor. Depending on the location of temperature sensor 410 relative to FET 404, the output of temperature sensor 410 may indicate the temperature of FET 404 or may indicate a temperature elsewhere in a system. Control logic 407 uses an ADC circuit in ADC 405 to measure the output voltage level, thereby creating a digital value representative of the temperature of the sensor. Control logic 407 may use this digital temperature value as it was received from ADC 405, or may adjust the value depending upon a formula or lookup table to correlate the temperature sensor reading to the temperature of FET 404.

Further operations of the method may depend on a temperature of system 400 (block 612). Control logic 407 determines if the temperature measured in block 610 is higher than a temperature previously measured during the charging mode. In some embodiments, control logic 407 may determine an $R_{DS(ON)}$ value corresponding to a highest temperature measured and an $R_{DS(ON)}$ value corresponding to a lowest temperature measured during respective recharging modes. In other embodiments, $R_{DS(ON)}$ values may be stored that are measured at temperatures closest to one or more predetermined target temperatures, such as, for example, 0° C., 27° C., and 40° C. For example, a given recharging operation may occur at 45° C. and control logic 407 may determine that the previous high temperature was 38° C. If a highest temperature is being used, then control logic 407 determines the 45° C. $R_{DS(ON)}$ value. In contrast, if a predetermined temperature of 40° C. is used, then the 38° C. $R_{DS(ON)}$ value is retained and a new $R_{DS(ON)}$ value is not calculated. In the present embodiment, if the temperature is not a new highest value, then the method moves to block 618 to determine if the temperature is a new lowest value. Otherwise, the method moves to block 614 to determine a new $R_{DS(ON)}$ value.

A high temperature value for the $R_{DS(ON)}$ of FET 404 is determined (block 614). To determine the new $R_{DS(ON)}$ value, control logic 407 determines a voltage across the source and drain terminals of FET 404 and a current passing through the same terminals. In the recharging operational mode, a predetermined current passes through FET 404 towards a rechargeable battery, such as, for example, battery 101 in FIG. 1. In some embodiments, a single current value may be used for recharging, while in other embodiments, one of a plurality of recharging current values may be used, dependent upon a type of recharging mode. In such embodiments, control logic 407 may determine which recharging mode is in use and determine the corresponding recharging current, for example, by reading from a table in a memory. In other embodiments, the value for the recharging current may be provided by a charging device communicating with system 400. Control logic 407 uses ADC 405 to determine the voltage across the terminals of FET 404. Once the voltage and the current are determined, the $R_{DS(ON)}$ can be calculated.

The new high temperature $R_{DS(ON)}$ value is stored (block 616). The new $R_{DS(ON)}$ value is written to a corresponding register location in register 408, along with the respective digital temperature value. In embodiments, in which target temperatures are used rather than highest and lowest temperatures, control logic 407 determines which target temperature the new $R_{DS(ON)}$ value corresponds to and saves the new value along with the respective digital temperature value. The method moves to block 624 to determine a temperature coefficient.

If, in block 612, a new highest temperature was not measured, then further operations of the method may again depend on the temperature of system 400 (block 618). Control logic 407 determines if the temperature measured in block 610 is lower than a temperature previously measured during the charging mode. If the temperature is not a new lowest value, then the method moves back to block 606 to determine if system 400 is still in the charging mode. Otherwise, the method moves to block 620 to determine a new $R_{DS(ON)}$ value corresponding to the new lowest temperature value.

A low temperature value for the $R_{DS(ON)}$ of FET 404 is determined (block 620). Similar to the description of block 614, control logic 407 determines a voltage across the source and drain terminals of FET 404 and a current passing through the same terminals to determine the new $R_{DS(ON)}$ value. Control logic 407 may determine the recharging current by reading values from a table in a memory, or the value for the recharging current may be provided by a charging device communicating with system 400. Control logic 407 uses ADC 405 to determine the voltage across the terminals of FET 404. Once the voltage and the current are determined, the low temperature $R_{DS(ON)}$ can be calculated.

The new low temperature $R_{DS(ON)}$ value is stored (block 622). As described in block 616 regarding the new high temperature $R_{DS(ON)}$ value, the new low temperature $R_{DS(ON)}$ value is written to a corresponding register location in register 408, along with the respective digital temperature value.

BMC 402 determines a value for a temperature coefficient for FET 404 (block 624). Using the newly stored values for $R_{DS(ON)}$ and temperature in addition to one or more previously stored values, control logic 407 determines a temperature coefficient, e.g., an amount of resistance per degree of temperature value (i.e., an ohms/° C. value). In some embodiments, equation (2) may be used to determine the temperature coefficient.

$$TC = (R_{DS(ON)HIGH} - R_{DS(ON)LOW}) \div (T_{FET(HIGH)} - T_{FET(LOW)}) \quad (2)$$

In equation (2), TC is the temperature coefficient, $R_{DS(ON)HIGH}$ is the $R_{DS(ON)}$ determined at the high temperature, $R_{DS(ON)LOW}$ is the $R_{DS(ON)}$ determined at the low temperature, $T_{FET(HIGH)}$ is the high temperature value, and $T_{FET(LOW)}$ is the low temperature value. The temperature coefficient may be stored in registers 408 or may be saved in a local memory, such as memory 302 in FIG. 3. The method may return to block 606 to determine if system 400 is still in the charging mode.

It is noted that the method illustrated in FIG. 6 is merely an example. In various embodiments, additional operations may be included, and/or some operations may be performed in a different sequence. In some embodiments, some operations may be executed in parallel, such as, for example, blocks 706 and 708.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus comprising:
one or more registers;
an analog-to-digital converter (ADC) configured to generate a first digital value corresponding to a difference in voltage levels between a first terminal and a second terminal of a transistor;
a sensor configured to measure a temperature; and
control logic configured to:
generate a control voltage level at a control terminal of the transistor;
receive the first digital value from the ADC;
read at least one value of a plurality of values stored in the one or more registers, wherein the plurality of values correspond to a characteristic of the transistor at a respective one of a plurality of temperatures;
during a first operational mode, determine, based on the first digital value, the at least one value of the plurality of values, and the temperature, a current passing through the transistor; and
during a second operational mode, update, based on the temperature, one or more values of the plurality of values.

2. The apparatus of claim 1, wherein the control logic is further configured to update the one or more values by:
determining, during the second operational mode, that the temperature is at a higher temperature value;
determining, during the second operational mode, a new value for the characteristic of the transistor based on the higher temperature value; and
updating, in the one or more registers, the one or more values of the plurality of values.

3. The apparatus of claim 1, wherein the control logic is further configured to update the one or more values by:
determining, during the second operational mode, that the temperature is at a lower temperature value;
determining, during the second operational mode, a new value for the characteristic of the transistor based on the lower temperature value; and
updating, in the one or more registers, the one or more values of the plurality of values.

4. The apparatus of claim 1, wherein the second operational mode corresponds to a battery charging mode.

5. The apparatus of claim 4, wherein to update the one or more values, the control logic is further configured to receive a value of a charging current from a charger circuit.

6. The apparatus of claim 1, wherein to generate the control voltage level at the control terminal of the transistor, the control logic is further configured to enable a charge pump.

7. The apparatus of claim 6, wherein the characteristic of the transistor includes an on resistance of the transistor.

8. A method, comprising:
generating a first voltage level at a first terminal of a transistor during a first operational mode;
measuring a difference between a second voltage level of a second terminal of the transistor and a third voltage level of a third terminal of the transistor;
measuring a temperature;
retrieving, from one or more registers, at least one value of a plurality of values, wherein each value of the plurality of values corresponds to a characteristic of the transistor at a respective one of a plurality of temperatures;
during the first operational mode, determining, based on the difference between the second voltage level and the third voltage level, the temperature, and the at least one value, a current passing through the transistor; and
during a second operational mode, updating, based on the temperature, one or more values of the plurality of values.

9. The method of claim 8, further comprising updating the one or more values by:
determining, during the second operational mode, that the temperature is at a lower temperature value;
determining, during the second operational mode, a new value for the characteristic of the transistor based on the lower temperature value; and
updating, in the one or more registers, the one or more values of the plurality of values.

10. The method of claim 8, further comprising updating the one or more values by:
determining, during the second operational mode, that the temperature is at a higher temperature value;
determining, during the second operational mode, a new value for the characteristic of the transistor based on the higher temperature value; and
updating, in the one or more registers, the one or more values of the plurality of values.

11. The method of claim 8, wherein the second operational mode corresponds to a battery charging mode.

12. The method of claim 8, wherein generating the first voltage level at the first terminal of the transistor further comprises enabling a charge pump.

13. The method of claim 12, further comprising adjusting the first voltage level based on a measurement of the first voltage level.

14. The method of claim 8, wherein the characteristic of the transistor corresponds to a resistance between the second terminal of the transistor and the third terminal of the transistor.

15. A system comprising:
a transistor, wherein a first terminal of the transistor is coupled to a power supply unit and a second terminal of the transistor is coupled to a power supply terminal of a circuit; and
a power management circuit coupled to the transistor, wherein the power management circuit is configured to:
store, in one or more registers, a plurality of values wherein each value of the plurality of values corresponds to a characteristic of the transistor at a respective one of a plurality of temperatures;
generate a first voltage level at a third terminal of the transistor;
measure a temperature;
measure a difference between a second voltage level at the first terminal and a third voltage level at the second terminal;
read at least one value of a plurality of values;
during a first operational mode, determine, based on the difference, the temperature, and at least one value of the plurality of values, a current passing through the transistor; and
during a second operational mode, update, based on the temperature, one or more values of the plurality of values.

16. The system of claim 15, wherein the power management circuit is further configured to adjust the first voltage level based on a measured value of the first voltage level.

17. The system of claim 15, wherein the power supply unit includes at least one battery.

18. The system of claim 15, wherein the power management circuit is further configured to update the one or more values by:
    determining, during the second operational mode, that the temperature is at a lower temperature value;
    determining, during the second operational mode, a new value for the characteristic of the transistor based on the lower temperature value, wherein a predetermined current passes through the transistor in the second operational mode; and
    update the one or more values of the plurality of values.

19. The system of claim 15, wherein the power management circuit is further configured to update the one or more values by:
    determining, during the second operational mode, that the temperature is at a higher temperature value;
    determining, during the second operational mode, a new value for the characteristic of the transistor based on the higher temperature value, wherein a predetermined current passes through the transistor in the second operational mode; and
    update the one or more values of the plurality of values.

20. The system of claim 15, wherein the transistor comprises a metal-oxide semiconductor field-effect transistor.

\* \* \* \* \*